US009255967B2

(12) United States Patent
Ahmadi et al.

(10) Patent No.: US 9,255,967 B2
(45) Date of Patent: Feb. 9, 2016

(54) SYSTEM AND METHOD FOR MEASURING AN INTEGRATED CIRCUIT AGE

(71) Applicant: NVIDIA Corporation, Santa Clara, CA (US)

(72) Inventors: Rubil Ahmadi, Sunnyvale, CA (US); Varghese George, Walnut Creek, CA (US); Suhas Mysore Satheesh, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 380 days.

(21) Appl. No.: 13/861,318

(22) Filed: Apr. 11, 2013

(65) Prior Publication Data
US 2014/0306687 A1 Oct. 16, 2014

(51) Int. Cl.
*G01R 25/00* (2006.01)
*G01R 31/08* (2006.01)
*G01R 31/317* (2006.01)
*G01R 25/04* (2006.01)
*H02H 3/38* (2006.01)
*G01R 27/28* (2006.01)

(52) U.S. Cl.
CPC .......... *G01R 31/31727* (2013.01); *G01R 25/00* (2013.01); *G01R 25/04* (2013.01); *G01R 27/28* (2013.01); *H02H 3/382* (2013.01)

(58) Field of Classification Search
CPC .. G01R 31/31727; G01R 25/00; G01R 25/04; G01R 27/28; H02H 3/382

USPC .............. 324/76.11, 76.39, 76.52, 76.77, 86, 324/500, 512, 521, 622, 620, 612, 600, 650, 324/649

See application file for complete search history.

(56) References Cited

U.S. PATENT DOCUMENTS

| | | | | |
|---|---|---|---|---|
| 5,881,374 | A * | 3/1999 | Osterberg | 455/115.1 |
| 6,263,034 | B1 * | 7/2001 | Kanack et al. | 375/371 |
| 7,002,358 | B2 * | 2/2006 | Wyatt | 324/622 |
| 7,760,000 | B2 * | 7/2010 | Sano | 327/293 |
| 8,671,305 | B1 * | 3/2014 | Shih et al. | 713/600 |
| 2003/0221143 | A1 * | 11/2003 | Kurd et al. | 714/700 |
| 2006/0049886 | A1 * | 3/2006 | Agostinelli et al. | 331/175 |
| 2009/0121757 | A1 * | 5/2009 | Kim et al. | 327/149 |

OTHER PUBLICATIONS

U.S. Appl. No. 13/604,283, filed Sep. 5, 2012.
Kim, T.-H. et al., "Silicon Odometer: An On-Chip Reliability Monitor for Measuring Frequency Degradation of Digital Circuits," IEEE Journal of Solid-State Circuits, Apr. 2008, vol. 43, No. 4, pp. 874-880.

* cited by examiner

*Primary Examiner* — Hoai-an D Nguyen
(74) *Attorney, Agent, or Firm* — Zilka-Kotab, PC

(57) ABSTRACT

A system and method are provided for measuring an integrated circuit age. A first clock generator is provided for generating a first clock signal and a second clock generator is provided for generating a second clock signal. Further, a phase detector in communication with the first clock generator and the second clock generator is provided for receiving the first clock signal from the first clock generator and the second clock signal from the second clock generator, and outputting a phase difference signal that is capable of being used as a measure of an integrated circuit age. Still yet, a circuit in communication with the phase detector and the first clock generator is provided for receiving the first clock signal from the first clock generator and the phase difference signal from the phase detector and for synchronizing the phase difference signal from the phase detector with the first clock signal from the first clock generator.

19 Claims, 4 Drawing Sheets

SYSTEM AND METHOD FOR MEASURING AN INTEGRATED CIRCUIT AGE

FIELD OF THE INVENTION

The present invention relates to integrated circuits, and more particularly to measuring aging associated with integrated circuits.

BACKGROUND

Integrated circuits are electronic circuits that are typically manufactured from a semiconductor material (e.g. silicon, etc.). Due to the reliability of integrated circuits and developments within the industry that allow integrated circuits to be mass produced, the usage of integrated circuits has become ubiquitous in the manufacture of many commercial electronics equipment produced today and have contributed significantly to the proliferation and development of the electronics industry. Integrated circuits are often combined to form products including various devices or components, which both comprise an underlying computing system, and are integrated as peripheral devices in the computing system, etc.

Integrated circuit developers typically design an integrated circuit with an intended lifetime before failure. During a typical design phase for an integrated circuit, an integrated circuit developer generally specifies the voltages and frequencies at which the integrated circuit or "chip" is going to operate with and/or under. However, these operating conditions (along with temperature) may contribute to aging effects that naturally occur with silicon or like-material based products.

These conditions can change as aging effects and wear are accumulated by an integrated circuit product. For example, a product which requires a certain voltage to operate under a specific frequency at the beginning of the lifetime of the product may require a higher voltage to operate under the same frequency later in the lifetime of the product, due to the aging effect. Moreover, the operating conditions can fluctuate drastically and frequently, depending on usage of the underlying computing system, which, naturally, can vary from user to user. As a result, designing an integrated circuit with sufficient tolerances to last the intended lifespan under such wildly varying conditions can be a complex process.

Further, ever shrinking deep-submicron geometries come with multiple degree of complexity both at design and fabrication. These complexities include thermal management, power distribution, cross-talking, and electromigration. Thus, it is helpful to understand the silicon degradation of an integrated circuit to precisely predict how the system behaves with aging. Silicon degradation refers to deterioration of system performance over time and usage.

One major silicon degradation consequence is change in the threshold voltage of the transistors which significantly determines various factors such as system slack, operating frequency, setup-hold constraints, and on-chip parasitics, among other factors. With continued deep-submicron scaling, reliability issues such as hot carrier injection (HCI), bias temperature instability (BTI), and time-dependent dielectric breakdown (TDDB) have become more prevalent. There is thus a need for addressing these and/or other issues associated with the aging of integrated circuits.

SUMMARY

A system and method are provided for measuring an integrated circuit age. A first clock generator is provided for generating a first clock signal. Additionally, a second clock generator is provided for generating a second clock signal. Further, a phase detector is provided that is in communication with the first clock generator and the second clock generator. The phase detector is operable for receiving the first clock signal from the first clock generator and the second clock signal from the second dock generator, and outputting a phase difference signal. Still yet, a circuit is provided that is in communication with the phase detector and the first clock generator. The circuit is operable for receiving the first clock signal from the first clock generator and the phase difference signal from the phase detector. The circuit is further operable for synchronizing the phase difference signal from the phase detector with the first clock signal from the first clock generator. Moreover, the phase difference signal is capable of being used as a measure of an integrated circuit age.

DETAILED DESCRIPTION

Figure 1:
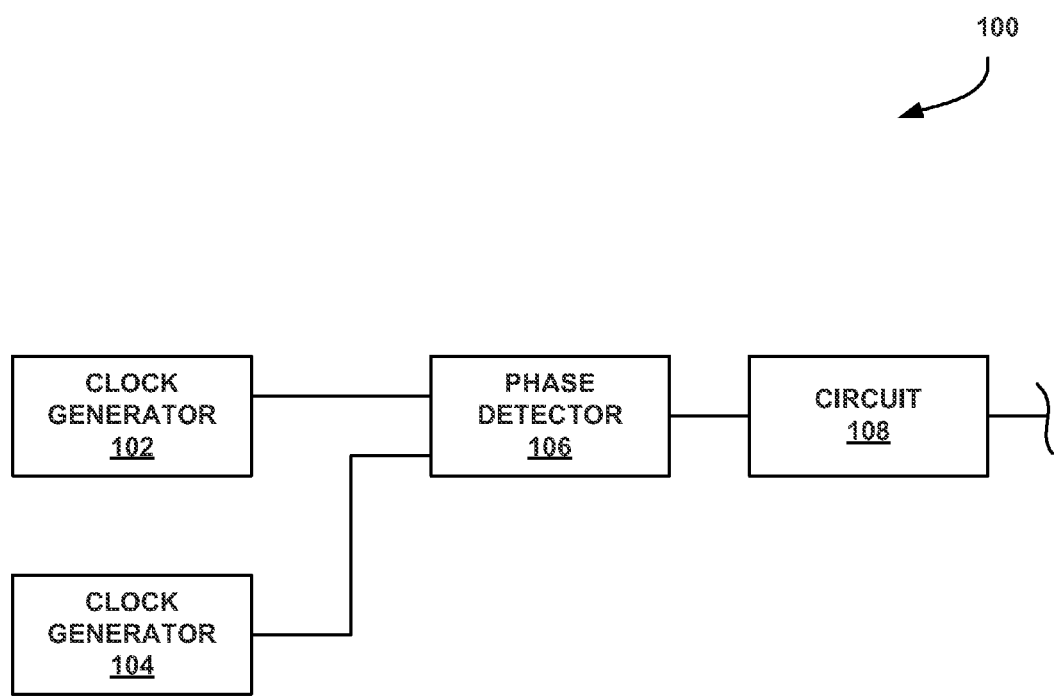
FIG. 1 shows an apparatus for measuring an integrated circuit age, in accordance with one embodiment.

FIG. 1 shows an apparatus 100 for measuring an integrated circuit age, in accordance with one embodiment.

As shown, the apparatus 100 includes a first clock generator 102 for generating a first dock signal. Additionally, the apparatus 100 includes a second clock generator 104 for generating a second clock signal. Furthermore, the apparatus 100 includes a phase detector 106 in communication with the first dock generator 102 and the second clock generator 104.

The phase detector 106 is operable for receiving the first clock signal from the first clock generator 102 and the second clock signal from the second clock generator 104, and outputting a phase difference signal. Further, the apparatus 100 includes a circuit 108 in communication with the phase detector 106 and the first clock generator 102. The circuit 108 is operable for receiving the first clock signal from the first dock generator 102 and the phase difference signal from the phase detector 106.

The circuit 108 is further operable for synchronizing the phase difference signal from the phase detector 106 with the first clock signal from the first clock generator 102. In use, the phase difference signal is capable of being used as a measure of an integrated circuit age.

In the context of the present description, a clock generator refers to any circuit or component that is capable of producing a timing signal (i.e. a clock signal, etc.). In one embodiment, the clock signal may include a symmetrical square wave. Of course, in various embodiments, the clock signal may include any type of signal, including more complex arrangements.

Furthermore, in various embodiments, the first clock generator 102 and the second clock generator 104 may include various components. For example, in one embodiment, the first clock generator 102 may include a first ring oscillator and the second dock generator 104 may include a second ring oscillator.

Further, in one embodiment, the first clock generator 102 may include an aging clock generator and the second clock generator 104 may include a reference clock generator that generators a reference clock signal. For example, in one embodiment, the first clock generator 102 may be powered continuously, such that the clock generator is able to continuously age from use (i.e. is stressed from use, etc.). Additionally, in one embodiment, the first clock generator 102 may be continuously powered on and the second clock generator 104 may be selectively powered on. In this way, in one embodiment, the aging of the second clock generator 104 from use may be limited and/or negligible.

The phase detector 106 may include any circuit or component operable for receiving the first clock signal from the first clock generator 102 and the second clock signal from the second clock generator 104, and outputting the phase difference signal. For example, in one embodiment, the phase detector 106 may include an AND gate. In the context of the present description, the phase difference signal may refer to a signal capable of indicating the phase difference between the first clock signal from the first clock generator 102 and the second dock signal from the second clock generator 104.

The circuit 108 may include any component or components capable of being utilized to synchronize the phase difference signal from the phase detector 106 with the first clock signal from the first clock generator 102. For example, in one embodiment, the circuit 108 may include a flip-flop with a first input in communication with the phase detector 106 for receiving the phase difference signal from the phase detector 106. Further, in one embodiment, the circuit 108 may include a delay component with an input in communication with the second clock generator 104 for receiving the second clock signal from the second clock generator 104, and an output in communication with a second input of the flip-flop.

Still yet, in one embodiment, the apparatus 100 may include a filter in communication with the circuit 108. In one embodiment, the filter may be operable for filtering anomalies from an output of the circuit 108. For example, in on embodiment, the filter may be operable for filtering glitches in a clock signal difference.

In various embodiments, the filter may include different components for filtering anomalies. For example, in one embodiment, the filter may include a state machine. Furthermore, in one embodiment, the filter may be in communication with the second dock generator 104 for utilizing the second clock signal or a derivative thereof for synchronization purposes.

In one embodiment, the filter may be in communication with the second clock generator 104 via a delay component operable for delaying the second clock signal. Still yet, in one embodiment, the apparatus 100 may include a counter in communication with the filter for outputting an indication of the measure of the integrated circuit age.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
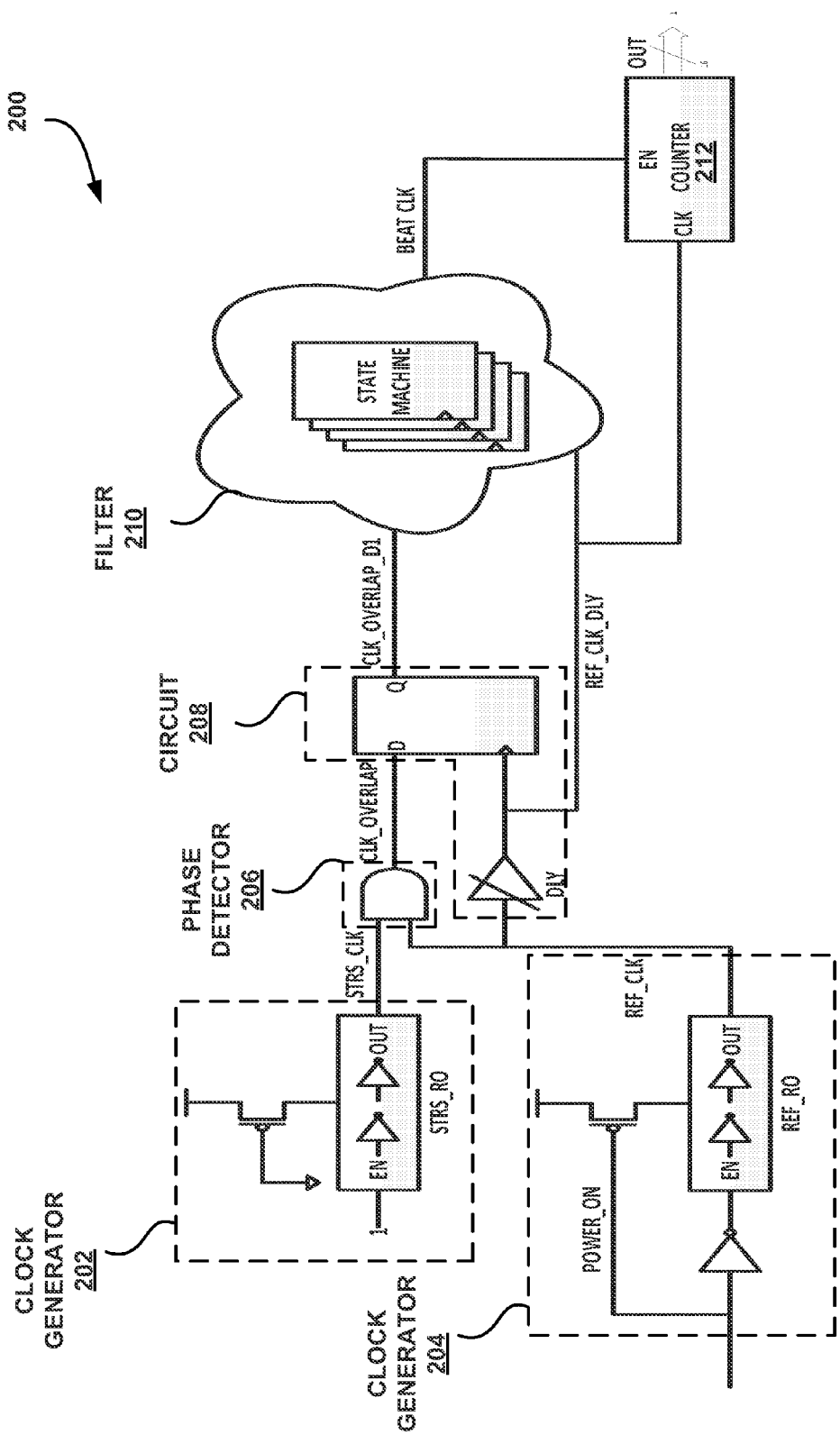
FIG. 2 shows an apparatus for measuring an integrated circuit age, in accordance with another embodiment.

FIG. 2 shows an apparatus 200 for measuring an integrated circuit age, in accordance with another embodiment. As an option, the apparatus 200 may be implemented in the context of the previous Figure and/or any subsequent FIG(s). Of course, however, the apparatus 200 may be implemented in any desired environment. It should also be noted that the aforementioned definitions may apply during the present description.

As shown, the apparatus 200 includes a first clock generator 202 including a first ring oscillator for generating a first clock signal. Additionally, the apparatus 200 includes a second clock generator 204 including a second ring oscillator for generating a second dock signal. Furthermore, the apparatus 200 includes a phase detector 206 including an AND gate in communication with the first clock generator 202 and the second clock generator 204.

The phase detector 206 is operable for receiving the first clock signal from the first clock generator 202 and the second clock signal from the second clock generator 204, and outputting a phase difference signal. Further, the apparatus 200 includes a circuit 208 in communication with the phase detector 206 and the first clock generator 202. The circuit 208 is operable for receiving the first clock signal from the first clock generator 202 and the phase difference signal from the phase detector 206.

The circuit 208 is further operable for synchronizing the phase difference signal from the phase detector 206 with the first clock signal from the first clock generator 202. As shown, the circuit 208 includes a flip-flop with a first input in communication with the phase detector 206 for receiving the phase difference signal from the phase detector 206. The circuit 208 also includes a delay component with an input in communication with the second clock generator 204 for receiving the second clock signal from the second clock generator, and an output in communication with a second input of the flip-flop.

Further, the apparatus 200 includes a filter 210 in communication with the circuit. The filter 210 is also in communication with the second clock generator 204 for utilizing the second clock signal or a derivative thereof for synchronization purposes. In use, the filter 210 is operable for filtering anomalies from an output of the circuit 208.

As shown further, the filter 210 includes a state machine. Additionally, the apparatus 200 includes a counter 212 in communication with the filter 210 for outputting an indication of the measure of the integrated circuit age. In use, the phase difference signal is capable of being used as a measure of an integrated circuit age. In one embodiment, this measure may be utilized to address performance issues that result from aging integrated circuits.

For example, ever shrinking deep-submicron geometries come with multiple degree of complexity both at design and fabrication. These complexities include thermal management, power distribution, cross-talking, and electromigration. Thus, it is valuable to understand the silicon degradation of an integrated circuit to precisely predict how the system behaves with aging.

Silicon degradation refers to deterioration of system performance over time and usage. One major silicon degradation consequence is change in the threshold voltage of the transistors, which significantly determines various factors such as system slack, operating frequency, setup-hold constraints, and on-chip parasitic, among other factors. With continued deep-submicron scaling, reliability issues such as hot carrier injection (HCI), bias temperature instability (BTI) and time-dependent dielectric breakdown (TDDB) have become more prevalent.

Accordingly, the apparatus 200 utilizes a ring oscillator configuration to model the aging of an integrated circuit. The consequence of aging is reflected on the deceleration of the aged ring oscillator (e.g. the first clock generator 202) frequency. In one embodiment, the apparatus 200 may utilize identical power gated ring oscillators, each modeling the type of aging desired. The apparatus also includes a reference ring oscillator (e.g., the second clock generator 204) that is used as a yard stick to estimate frequency deviation due to aging.

Accordingly, the first clock generator 202 may include a stressed (aging) ring oscillator and the second clock generator 204 may include a reference ring oscillator. In one embodiment, the stressed ring oscillator may have a continuous supply of power through an always-ON power gate and an always-ON enable that keeps the ring oscillator continuously toggling. On the other hand, the reference ring oscillator may have a controllable power gate and enable that may be selectively turned ON. This will allow the stress ring oscillator to age over time and allow for the reference ring oscillator to serve as a yard stick to measure aging.

In various embodiments, the stressed ring oscillator may have a different topology for different types of aging effects (e.g. NBTI, HCI, etc.). In one embodiment, the two ring oscillators may be selected to be as identical as possible (e.g. in terms of power gating, layout parasitic's, distance from pad, distance from heat sink, etc.) in order to estimate aging accurately. In one embodiment, the two oscillators may be calibrated, such that an initial offset is determined.

In one embodiment, the apparatus 200 may be utilized to generate an output that gives a precise estimate of silicon degradation over time. In one embodiment, this may be achieved with a beat frequency generator (e.g. the phase detector 206, etc.) that outputs a signal with transitions that are proportional to the deviation in frequency between the two ring oscillators (i.e. equal to $f_{ref}-f_{strs}$). This frequency may subsequently be used to enable a counter (e.g. the counter 212) that is clocked by the reference ring oscillator. Thus, the counter output is equal to the reference frequency signal divided by the difference of the reference frequency signal and the frequency signal of the stressed ring oscillator. In other words: Counter Output=$f_{ref}/(f_{ref}-f_{strs})$. This gives the fraction of frequency deviation in the stress ring oscillator with respect to the frequency of reference ring oscillator.

The circuit 208 catches the overlapping region of the two signals (e.g. CLK_OVERLAP in FIG. 2) and flop it with the reference ring oscillator clock output. In this case, the delayed version of the reference ring oscillator (e.g. REF_CLK_INT_dly in FIG. 2) is used to account for the delay of the AND gate. At the flop output, the signal will repetitively widen and narrow depending on the amount of overlap.

From a digital perspective, this can be seen as a 0-1 combination. An increasing overlap is counted 1 while a decreasing overlap is counted 0. Perfectly identical signals will produce a 0 (or 1) only output with no transitions (0 frequency), while a large difference in frequency will result in larger frequency of output signal.

In some cases, intermittent jitters on the ring oscillator can cause false transitions in the signal, thus producing a false beat frequency. In one embodiment, this may be remedied by a state machine of the filter 210 that creates a dead zone when the transitions on flop output are less than or equal to two cycles of reference ring oscillator frequency.

Thus, utilizing the apparatus 200, aging may be determined as a fraction of frequency deviation of the stressed ring oscillator with respect to a reference ring oscillator. In various embodiments, the stressed ring oscillator operation may be configured and modeled in accordance to any feature of interest (e.g. HCI, NBTI, TDDB, etc.).

Accordingly, various embodiments, the apparatus 200 may function to utilize ring oscillator frequency to estimate silicon degradation, utilize the phase detector 206 to estimate frequency deviation due to aging, use the filter 210 (e.g. an ESM based filter, etc.) to eliminate jitter induced intermittent frequency deviation, and/or utilize the beat frequency and the counter 212 to estimate the fraction of frequency deviation.

Figure 3:
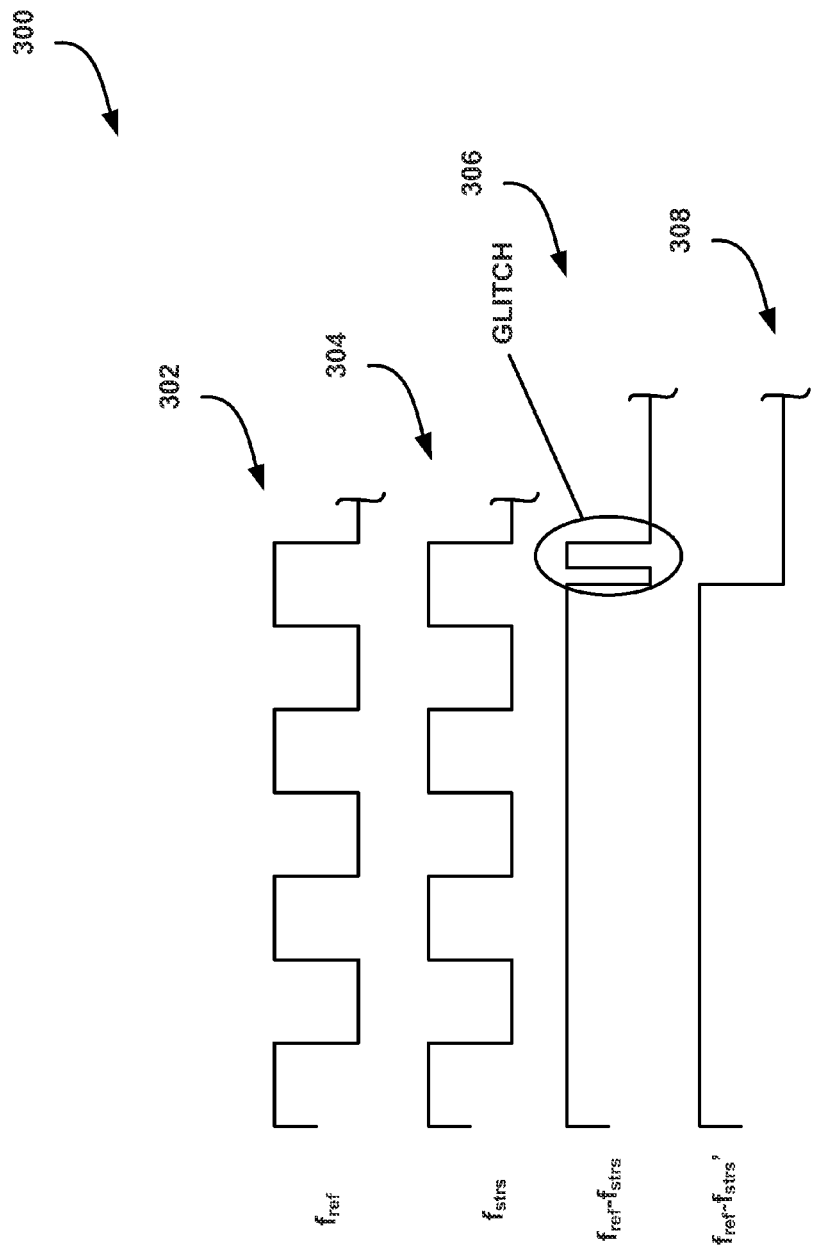
FIG. 3 shows a series of signals illustrating an elimination of it induced intermittent frequency deviation, in accordance with one embodiment.

FIG. 3 shows a series of signals 300 illustrating an elimination of jitter induced intermittent frequency deviation, in accordance with one embodiment. As an option, the signals 300 may be viewed in the context of the previous Figure and/or any subsequent Figure(s). Of course, however, the signals 300 may be viewed in the context of any desired environment. It should also be noted that the aforementioned definitions may apply during the present description.

As shown, in one embodiment, a ring oscillator (e.g. a reference ring oscillator) may output a signal 302 and another ring oscillator (e.g. a stressed ring oscillator) may output a signal 304. Further, in one embodiment, a beat frequency generator (e.g. a phase detector, etc.) may output a signal 306 with transitions that are proportional to the deviation in frequency between the two ring oscillators (i.e. equal to $f_{ref}-f_{strs}$). In one embodiment, this frequency may be used to enable a counter that is clocked by the reference ring oscillator.

In one embodiment, a circuit may catch the overlapping region of the two signals and flop it with the reference ring oscillator clock output. At the flop output, the signal will repetitively widen and narrow depending on the amount of overlap. As noted, this may be viewed as a 0-1 combination. An increasing overlap is counted 1 while a decreasing overlap is counted 0. Perfectly identical signals will produce a 0 or 1 only output with no transitions (0 frequency), while a large difference in frequency will result in larger frequency of output signal.

In some cases, however, intermittent jitters on the ring oscillator may cause false transitions in the signal, thus producing a false beat frequency as depicted by the "glitch" in signal 306. Accordingly, in one embodiment, the false beat frequencies may be remedied by a state machine that creates a dead zone when the transitions on flop output are less than or equal to two cycles of reference ring oscillator frequency, resulting in a filtered signal 308. Of course, in various other embodiments, the transitions on flop output may be determined to be less than or equal to any number of clock cycles.

Figure 4:
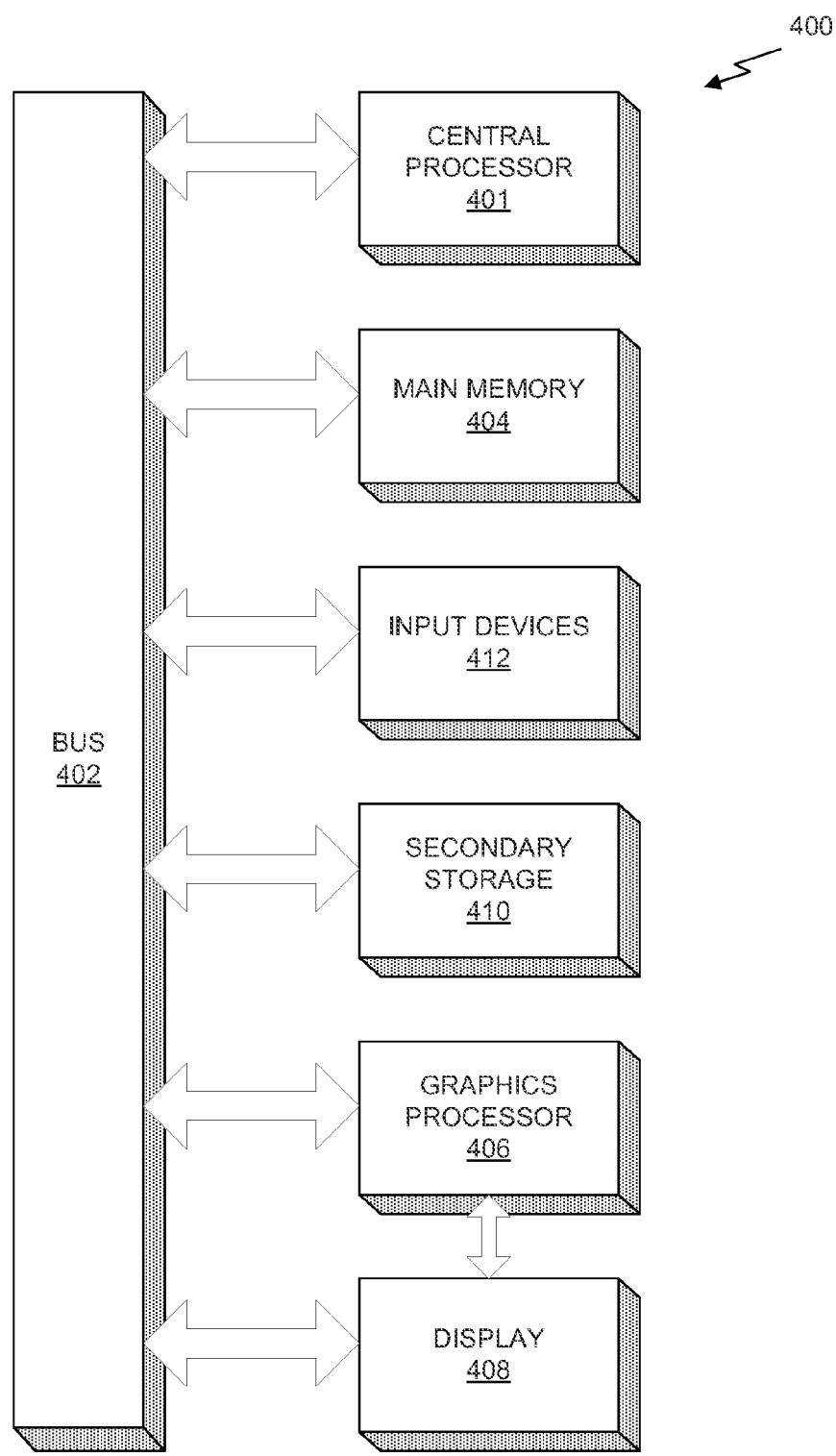
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one central processor 401 that is connected to a communication bus 402. The communication bus 402 may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM).

The system 400 also includes input devices 412, a graphics processor 406, and a display 408, i.e. a conventional CRT (cathode ray tube), LCD (liquid crystal display), LED (light emitting diode), plasma display or the like. User input may be received from the input devices 412, e.g., keyboard, mouse, touchpad, microphone, and the like. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 404 and/or the secondary storage 410. Such computer programs, when executed, enable the system 400 to perform various functions. The main memory 404, the storage 410, and/or any other storage are possible examples of computer-readable media.

In one embodiment, the architecture and/or functionality of the various previous figures may be implemented in the context of the central processor 401, the graphics processor 406, an integrated circuit (not shown) that is capable of at least a portion of the capabilities of both the central processor 401 and the graphics processor 406, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices including, but not limited to a personal digital assistant (PDA) device, a mobile phone device, a television, etc.

Further, while not shown, the system 400 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
    a first clock generator for generating a first clock signal;
    a second clock generator for generating a second clock signal;
    a phase detector in communication with the first clock generator and the second clock generator, the phase detector operable for receiving the first clock signal from the first clock generator and the second clock signal from the second clock generator, and outputting a phase difference signal; and
    a circuit in communication with the phase detector and the first clock generator, the circuit operable for receiving the first clock signal from the first clock generator and the phase difference signal from the phase detector, the circuit further operable for synchronizing the phase difference signal from the phase detector with the first clock signal from the first clock generator;
    wherein the phase difference signal is capable of being used as a measure of an integrated circuit age.

2. The apparatus of claim 1, wherein the first clock generator includes a first ring oscillator and the second clock generator includes a second ring oscillator.

3. The apparatus of claim 1, wherein the first clock generator includes an aging clock generator and the second clock generator includes a reference clock generator that generators a reference clock signal.

4. The apparatus of claim 1, wherein the first clock generator is continuously powered on and the second clock generator is selectively powered on.

5. The apparatus of claim 1, wherein the phase detector includes an AND gate.

6. The apparatus of claim 1, wherein the circuit is operable to synchronize the phase difference signal from the phase detector with the first clock signal from the first clock generator by including:
    a flip-flop with a first input in communication with the phase detector for receiving the phase difference signal from the phase detector, and
    a delay component with an input in communication with the second clock generator for receiving the second clock signal from the second clock generator, and an output in communication with a second input of the flip-flop.

7. The apparatus of claim 1, and further comprising a filter in communication with the circuit, the filter operable for filtering anomalies from an output of the circuit.

8. The apparatus of claim 7, and further comprising a counter in communication with the filter for outputting an indication of the measure of the integrated circuit age.

9. The apparatus of claim 7, wherein the filter includes a state machine.

10. The apparatus of claim 7, wherein the filter is further in communication with the second clock generator for utilizing the second clock signal or a derivative thereof for synchronization purposes.

11. The apparatus of claim 10, wherein the filter is further in communication with the second clock generator via a delay component operable for delaying the second clock signal.

12. An method, comprising:
    generating a first clock signal utilizing a first clock generator;
    generating a second clock signal utilizing a second clock generator;
    generating a phase difference signal utilizing a phase detector;
    synchronizing the phase difference signal from the phase detector with the first clock signal from the first clock generator, utilizing a circuit; and
    providing a measure of an integrated circuit age based on the phase difference signal.

13. The method of claim 12, and further comprising filtering anomalies from an output of the circuit, utilizing a filter.

14. The method of claim 12, wherein the circuit includes a flip-flop with a first input in communication with the phase detector for receiving the phase difference signal from the phase detector.

15. The method of claim 14, wherein the circuit includes a delay component with an input in communication with the second clock generator for receiving the second clock signal from the second clock generator, and an output in communication with a second input of the flip-flop.

16. The apparatus of claim 13, wherein the filter is further in communication with the second clock generator for utilizing the second clock signal or a derivative thereof for synchronization purposes.

17. The method of claim 13, wherein the filter includes a state machine.

18. A system, comprising:
a processor including:
  a first clock generator for generating a first clock signal;
  a second clock generator for generating a second clock signal;
  a phase detector in communication with the first clock generator and the second clock generator, the phase detector operable for receiving the first clock signal from the first clock generator and the second clock signal from the second clock generator, and outputting a phase difference signal; and
  a circuit in communication with the phase detector and the first clock generator, the circuit operable for receiving the first clock signal from the first clock generator and the phase difference signal from the phase detector, the circuit further operable for synchronizing the phase difference signal from the phase detector with the first clock signal from the first clock generator;
wherein the phase difference signal is capable of being used as a measure of the processor.

19. The system of claim 18, wherein the processor includes a graphics processor in communication with memory and a central processing unit.

* * * * *